United States Patent
Takahashi et al.

(10) Patent No.: US 10,002,751 B2
(45) Date of Patent: Jun. 19, 2018

(54) ION BEAM IRRADIATION APPARATUS

(71) Applicant: NISSIN ION EQUIPMENT CO., LTD., Kyoto-shi, Kyoto (JP)

(72) Inventors: Naoya Takahashi, Kyoto (JP); Hideki Fujita, Kyoto (JP); Yosuke Yoshimura, Billerica, MA (US); Shigeki Sakai, Kyoto (JP)

(73) Assignee: NISSIN ION EQUIPMENT CO., LTD., Kyoto-shi, Kyoto (JP)

( * ) Notice: Subject to any disclaimer, the term of this patent is extended or adjusted under 35 U.S.C. 154(b) by 0 days. days.

(21) Appl. No.: 15/337,016

(22) Filed: Oct. 28, 2016

(65) Prior Publication Data
US 2017/0243730 A1   Aug. 24, 2017

(30) Foreign Application Priority Data
Feb. 22, 2016   (JP) .................................. 2016-030922

(51) Int. Cl.
| | |
|---|---|
| *H01J 37/30* | (2006.01) |
| *H01J 49/42* | (2006.01) |
| *H01J 49/06* | (2006.01) |
| *H01J 37/317* | (2006.01) |

(52) U.S. Cl.
CPC ........ *H01J 49/421* (2013.01); *H01J 37/3171* (2013.01); *H01J 49/065* (2013.01)

(58) Field of Classification Search
CPC ........ H01J 49/26; H01J 49/065; H01J 49/421; H01J 37/10; H01J 37/244; H01J 37/3171
See application file for complete search history.

(56) References Cited

U.S. PATENT DOCUMENTS

| | | | | |
|---|---|---|---|---|
| 6,268,606 B1* | 7/2001 | Abe | ..................... | H01J 37/1472 |
| | | | | 250/396 R |
| 8,680,491 B2 | 3/2014 | Tanjo | | |
| 2003/0066976 A1* | 4/2003 | Chen | ..................... | H01J 37/244 |
| | | | | 250/492.21 |
| 2005/0224723 A1* | 10/2005 | Chae | ................... | H01J 37/3171 |
| | | | | 250/492.21 |
| 2007/0295901 A1* | 12/2007 | Kellerman | .............. | H01J 37/12 |
| | | | | 250/283 |

(Continued)

FOREIGN PATENT DOCUMENTS

JP    2012-238403 A    12/2012

*Primary Examiner* — David E Smith
(74) *Attorney, Agent, or Firm* — Sughrue Mion, PLLC

(57) ABSTRACT

An ion beam irradiation apparatus is provided. The apparatus includes an ion source, a mass separator, and an energy filter. The mass separator sorts dopant ions having a specific mass number and valence from an ion beam extracted from the ion source, and outputs the dopant ions. The energy filter is formed to define a beam passing region for allowing the ion beam to pass therethrough, and configured to have a given filter potential in response to application of a voltage thereto to separate passable ions capable of passing through the beam passing region and non-passable ions incapable of passing through the beam passing region, from each other by a difference in ion energy. The given filter potential is set such that the dopant ions are included in the passable ions, and a portion of unwanted ions which cannot be separated from the dopant ions by the mass separator are included in the non-passable ions.

16 Claims, 7 Drawing Sheets

(56) References Cited

U.S. PATENT DOCUMENTS

2011/0186745 A1* 8/2011 Kqaga ............... H01J 27/26
                                                                      250/396 R
2015/0371822 A1* 12/2015 Amano ............... H01J 37/3171
                                                                      250/397

* cited by examiner

ION BEAM IRRADIATION APPARATUS

BACKGROUND

1. Field

Exemplary embodiments relate to an ion beam irradiation apparatus for irradiating a target with an ion beam extracted from an ion source to subject the target to treatment such as ion implantation.

2. Description of the Related Art

In some ion beam irradiation apparatuses, when a metal used, for example, as a chamber, is sputtered by plasma produced inside the chamber, during extraction of an ion beam, the resulting metal atoms can be scattered and ionized. In this case, the resulting metal ions (hereinafter referred to as "unwanted ions") are mixed in a target together with ions of a desired type (hereinafter referred to as "dopant ions"), causing property degradation of the target and manufacturing defects.

SUMMARY

Exemplary embodiments address the above-discussed disadvantages in the related art, and it is an aspect of the exemplary embodiments to reduce unwanted ions which would otherwise be included in an ion beam, more effectively than before.

According to an aspect of one or more exemplary embodiments, there is provided an ion beam irradiation apparatus that comprises an ion source; a mass separator for sorting out dopant ions having a specific mass number and valence from an ion beam extracted from the ion source, and outputting the dopant ions; and an energy filter formed to define a beam passing region for allowing the ion beam to pass therethrough, and configured to have a given filter potential in response to application of a voltage thereto to thereby separate passable ions capable of passing through the beam passing region and non-passable ions incapable of passing through the beam passing region, from each other by means of a difference in ion energy, wherein the filter potential is set to cause the dopant ions to be included in the passable ions, and cause at least part of unwanted ions which cannot be separated from the dopant ions by the mass separator to be included in the non-passable ions.

In the ion beam irradiation apparatus, the filter potential is set to cause the dopant ions to be included in the passable ions, and cause at least part of the unwanted ions to be included in the non-passable ions. Thus, for example, by setting the filter potential to become greater than a per-unit valence energy of each unwanted ion ionized outside a chamber constituting the ion source, such unwanted ions can be removed from the ion beam, so that it becomes possible to reduce unwanted ions which would otherwise be included in the ion beam, more effectively than before.

An amount of ion components included in the ion beam is greater on an upstream side of the mass separator than on a downstream side thereof. Thus, if the energy filter is disposed on the upstream side of the mass separator, relatively large damage is delivered to the energy filter when the ion beam collides with the energy filter. Therefore, for reducing damage to the energy filter caused by collision of the ion beam therewith, the energy filter may be disposed on the downstream side of the mass separator.

If energy of the ion beam is changed between before and after the energy filter, it becomes difficult to irradiate a target with the ion beam having desired energy.

Therefore, the energy filter may comprise three or more electrodes each of which is formed with an opening for allowing the ion beam to pass therethrough and which are provided along a traveling direction of the ion beam, wherein at least one of the electrodes is configured to have the filter potential, and each of the remaining electrodes is configured to have a potential less than the filter potential, and wherein each of two of the electrodes disposed at respective opposite ends thereof is configured to have an equal potential.

According to this feature, each of the two electrodes disposed at the respective opposite ends is configured to have an equal potential, so that a decelerating force and an accelerating force acting on ions in the ion beam passing through the energy filter becomes equal to each other, in terms of a total force. This makes it possible to equalize energy of the ion beam between before and after the energy filter and thus irradiate a target with the ion beam having desired energy.

The energy filter may further comprise a profile control electrode configured to be applied with a profile control voltage for controlling a profile of the ion beam.

According to this feature, it becomes possible to prevent the ion beam from excessively diverging or excessively converging, at positions before and after the energy filter.

The above ion beam irradiation apparatus may comprise a current detection section for detecting a beam current of the ion beam passing through the energy filter, or a current flowing through each of the electrodes, and a voltage control section for controlling the profile control voltage based on one or more current values detected by the current detection section.

According to this feature, it becomes possible to control a potential of the profile control electrode while monitoring the beam current or the current flowing through each of the electrodes, and thus reshape the ion beam to have a profile capable of avoiding collision with each electrode.

In the ion beam irradiation apparatus using a plurality of electrodes, for suppressing increases in overall size and manufacturing cost of the apparatus, one or more of the plurality of electrodes may be additionally used as an electrode of a beam line-forming member for forming a beam line through which the ion beam is allowed to pass, other than the energy filter.

For preventing undesired metal ions from being produced from the electrodes and mixed in a target, the electrodes may be made of an electrically-conductive non-metal material.

For allowing a filter function of the energy filter to be selectively used, the ion beam irradiation apparatus may be configured to be capable of switching, in an on-off manner, the application of the voltage to energy filter.

Exemplary embodiments can reduce unwanted ions which would otherwise be included in an ion beam, more effectively than before.

DESCRIPTION OF EXEMPLARY EMBODIMENTS

In order to prevent degradation discussed above, there is an ion beam irradiation apparatus that includes a mass separation magnet that sorts out dopant ions from an ion beam extracted from an ion source and outputting the dopant ions.

The mass separation magnet is constructed to generate a magnetic field thereinside so as to separate unwanted ions and dopant ions from each other, by utilizing the fact that, when a voltage at which ions are to be extracted is constant, a radius of curvature of an ion trajectory (hereinafter referred to as a "curvature radius") varies depending on a mass number and valence of ion, as shown in the following formula:

$$R = \frac{1}{B}\sqrt{\frac{2mV}{qe}},$$

where R: curvature radius; B: magnetic flux density; m: mass number of ion, q: valence of ion, V: voltage, and e: elementary charge.

However, some of the unwanted ions have a curvature radius close to that of the dopant ions, although they are different from the dopant ions in terms of mass number and valence. In this case, the mass separation magnet fails to separate such particular unwanted ions from the dopant ions, so that the particular unwanted ions will undesirably reach a target.

The reason why the particular unwanted ions exist is as follows. A part of metal atoms from a metal sputtered by plasma can be scattered to fly out of the chamber and then ionized. In this case, the voltage at which ions are to be extracted becomes less than for the remaining unwanted ions ionized inside the chamber. Thus, as to the "mV/q" in the above formula, the particular unwanted ions have a value close to that of the dopant ions.

Specific examples of the particular unwanted ions will be presented in the following Table. For example, in the case where dopant ions are $BF_2^+$, as to the "mV/q", some unwanted ions, such as $W^+$, $W^{2+}$, $W^{3+}$, $WF^+$, $WF^{2+}$, or $WF^{3+}$, are likely to have a mV/q value close to that of $BF_2^+$. In this case, the part of unwanted ions can undesirably reach a target without being separated from the dopant ions by the mass separation magnet.

TABLE 1

| Type of Ion | m | V | q | mV/q | Sortability |
|---|---|---|---|---|---|
| $W^+$ | 183 | 10.66 | 1 | 1950.78 | x |
| $W^+$ | 183 | 40 | 1 | 7320 | o |
| $W^{2+}$ | 183 | 21.32 | 2 | 1950.78 | x |
| $W^{2+}$ | 183 | 40 | 2 | 3660 | o |
| $W^{3+}$ | 183 | 31.98 | 3 | 1950.78 | x |
| $W^{3+}$ | 183 | 40 | 3 | 2440 | o |
| $WF^+$ | 201 | 9.66 | 1 | 1941.66 | x |
| $WF^+$ | 201 | 40 | 1 | 8040 | o |
| $WF^{2+}$ | 201 | 19.32 | 2 | 1941.66 | x |
| $WF^{2+}$ | 201 | 40 | 2 | 4020 | o |
| $WF^{3+}$ | 201 | 28.98 | 3 | 1941.66 | x |
| $WF^{3+}$ | 201 | 40 | 3 | 2680 | o |
| $BF_2^+$ | 49 | 40 | 1 | 1960 | |

With reference to the drawings, an ion beam irradiation apparatus according to an exemplary embodiment will now be described.

Figure 1:
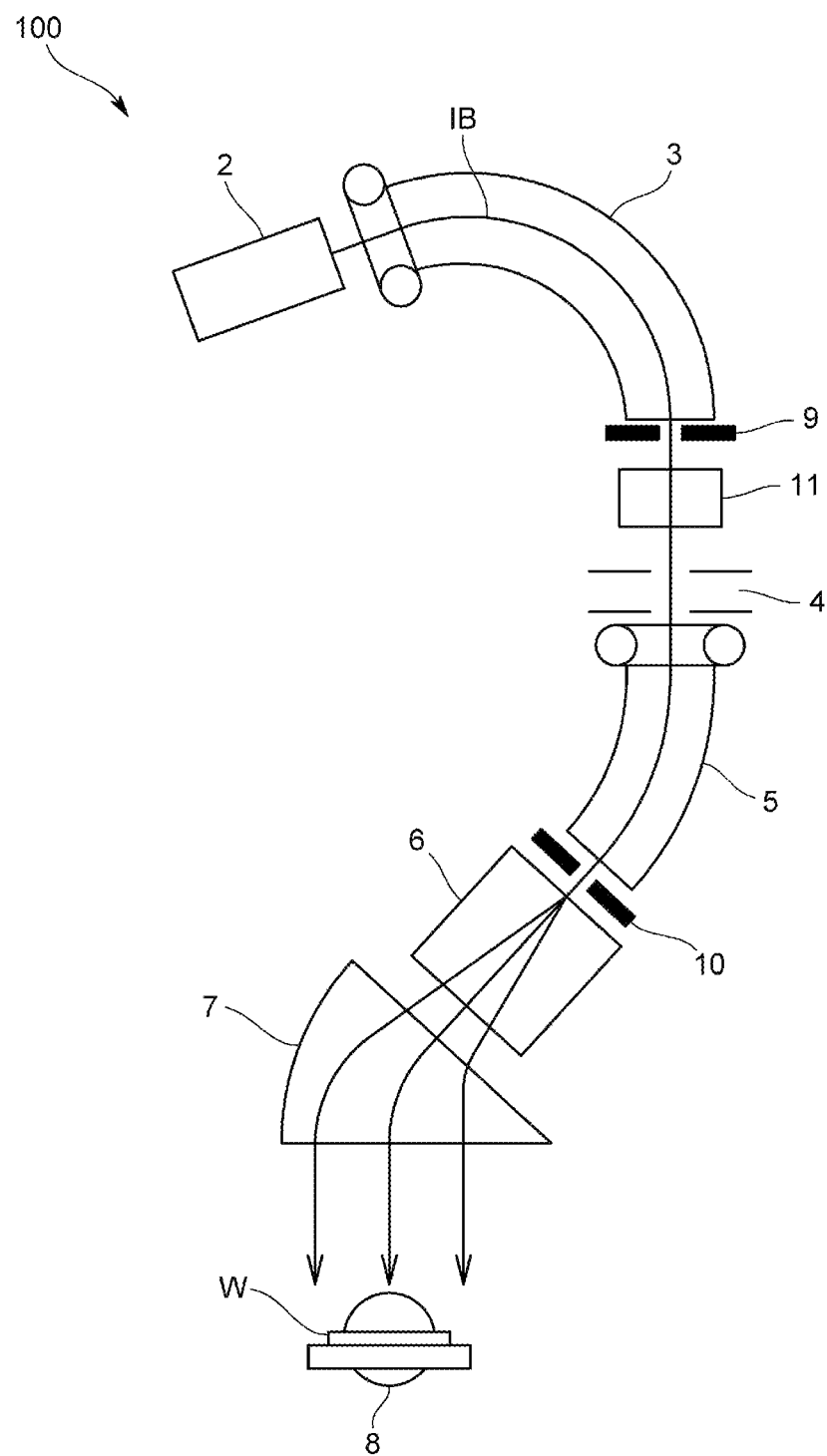
FIG. 1 is a schematic diagram depicting an overall configuration of an ion beam irradiation apparatus according to an exemplary embodiment.

As depicted in FIG. 1, the ion beam irradiation apparatus 100 according to an exemplary embodiment is designed to irradiate a target W with an ion beam IB to subject the target W to ion implantation, and comprises: an ion source 2 configured to allow the ion beam IB to be extracted therefrom; a mass separation magnet 3 provided on a downstream side of the ion source 2 and configured to serve as a mass separator for sorting out dopant ions of a desired type identified by a mass number and a valence, from the ion beam IB extracted from the ion source 2, and outputting the dopant ions; an acceleration tube 4 provided on a downstream side of the mass separation magnet 3 and configured to accelerate or decelerate the ion beam IB output from the mass separation magnet 3; an energy separation magnet 5 provided on a downstream side of the acceleration tube 4 and configured to serve as an energy separator for sorting out ions having a specific energy from the ion beam IB output from the acceleration tube 4, and outputting the ions having the specific energy; a scanning magnet 6 provided on a downstream side of the energy separation magnet 5 and configured to scan the ion beam IB output from the energy separation magnet 5, magnetically and one-dimensionally (in FIG. 1, in a direction along the drawing sheet); a beam parallelizing magnet 7 provided on a downstream side of the scanning magnet 6 and configured to bend back the ion beam IB output from the scanning magnet 6 to become parallel to a reference axis to perform parallel scanning of the ion beam IB in cooperation with the scanning magnet 6; and a scanning mechanism 8 provided on a downstream side of the beam parallelizing magnet 7 and configured to mechanically scan the target W (e.g., wafer) in a direction (in FIG. 1, in a front-back direction of the drawing sheet) substantially orthogonal to a scanning direction of the ion beam IB in the scanning magnet 6, within an irradiation region of the ion beam IB output from the beam parallelizing magnet 7.

The ion beam irradiation apparatus 100 is configured to irradiate the target W with a scanned spot beam. Alternatively, it may be configured to irradiate the target W with a ribbon beam having a size greater than that of the target W, in a direction orthogonal to a direction of the mechanical scanning of the target W. In this case, the scanning magnet 6 is not necessary.

The mass separation magnet 3 has a mass separation slit 9 provided at an ion outlet thereof and configured to allow ions sorted out by the mass separation magnet 3 to pass therethrough, and the energy separation magnet 5 has an energy separation slit 10 provided at an ion outlet thereof to allow ions sorted out by the energy separation magnet 5 to pass therethrough.

Figure 2:
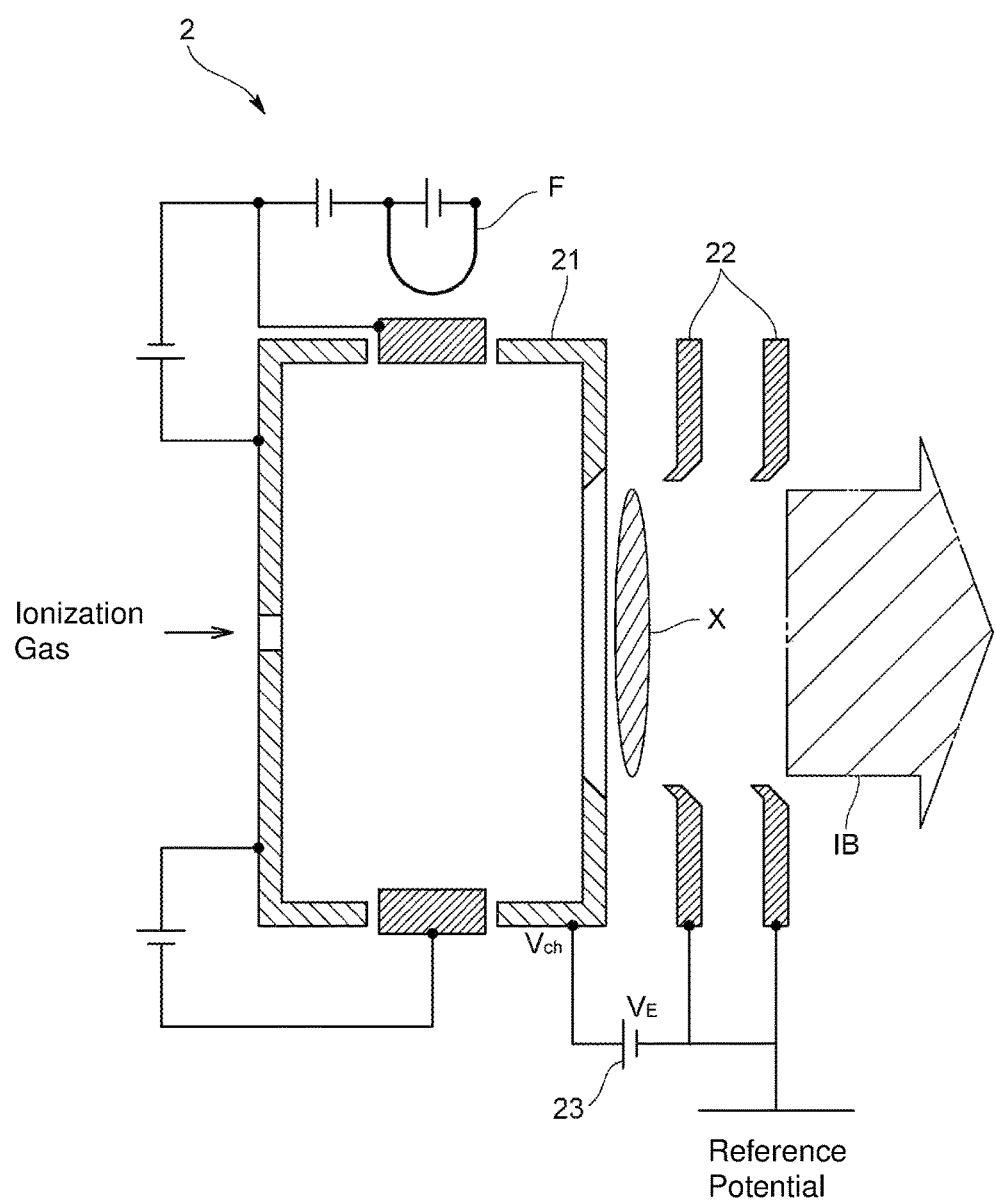
FIG. 2 is a schematic diagram depicting a configuration of an ion source of the ion beam irradiation apparatus of FIG. 1.

As depicted in FIG. 2, the ion source 2 comprises a chamber 21 serving as a plasma generation section for generating plasma by means, for example, of arc discharge, under a condition that ionization gas is introduced therein; and an extraction electrode 22 for extracting the ion beam IB from the chamber 21 by an action of an electric field, wherein an extraction voltage $V_E$ is applied therebetween from a DC extraction power supply 23 set such that a positive terminal thereof is connected to the chamber 21. Specifically, in this embodiment, for example, a reference potential is set to 210 kV, and the extraction voltage $V_E$ is set to 40 kV, to allow a potential $V_{ch}$ of the chamber 21 (hereinafter referred to as "chamber potential $V_{ch}$") to becomes 250 kV. It is to be understood that the reference potential is not limited to 210 kV, but may be appropriately changed, for example, to a ground potential.

Further, because an internal space of the chamber 21 has high temperatures during generation of plasma, the chamber 21, a filament F and other components of the ion source 2 are made of tungsten or molybdenum as a high-melting-point metal.

Each of the mass separation magnet 3 and the energy separation magnet 5 has a magnetic flux density B set to allow the dopant ions in the ion beam IB to pass therethrough.

A relationship of the magnetic flux density B of each of the mass separation magnet 3 and the energy separation magnet 5 and a mass number m and a valence q of each dopant ion can be expressed as the following formula:

$$B = \frac{1}{R}\sqrt{\frac{2mV}{qe}},$$

where R: curvature radius; B: magnetic flux density; m: mass number of ion, q: valence of ion, V: voltage, and e: elementary charge.

As depicted in FIG. 1, the ion beam irradiation apparatus 100 further comprises an energy filter 11 disposed on the downstream side of the mass separation magnet 3 and configured to sort out specific ions by means of a difference in ion energy.

Figure 3:
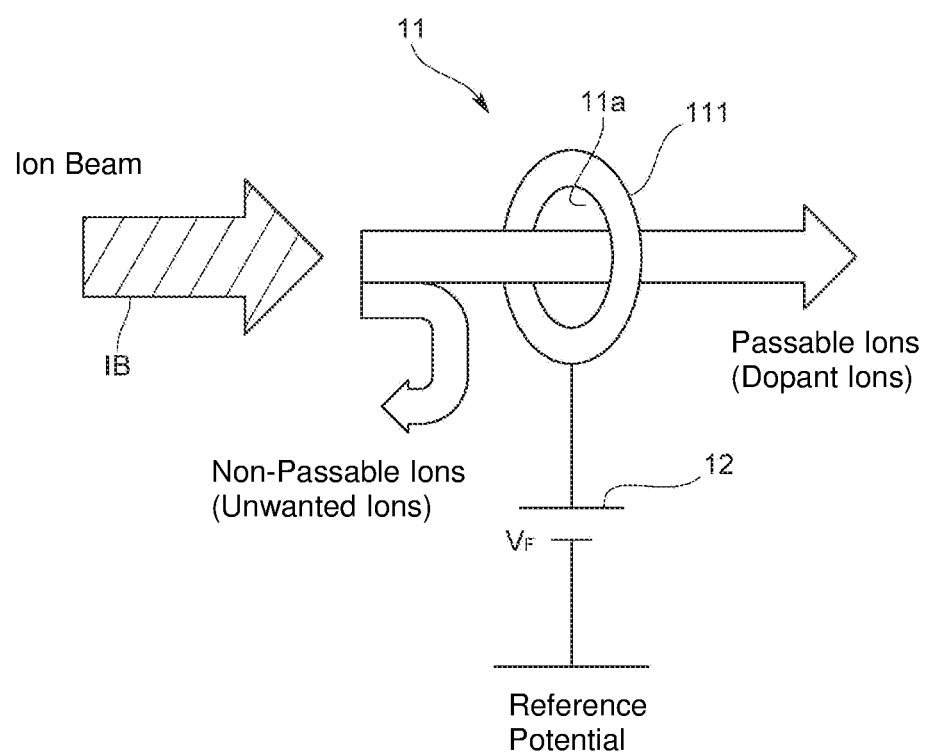
FIG. 3 is an explanatory schematic diagram of an energy filter of the ion beam irradiation apparatus of FIG. 1, according to an exemplary embodiment.

As depicted in FIG. 3, the energy filter 11 is formed to define a beam passing region 11a for allowing the ion beam IB to pass therethrough, and configured to have a given filter potential $V_{fil}$ in response to application of a given filter voltage $V_F$ from a filter power supply 12 to thereby separate passable ions capable of passing through the beam passing region 11a and non-passable ions incapable of passing through the beam passing region 11a, from each other.

The energy filter 11 in this exemplary embodiment is disposed between the mass separation magnet 3 and the acceleration tube 4, as depicted in FIG. 1, and comprises one electrode 111 formed to define the beam passing region 11a, as depicted in FIG. 3. The electrode 111 is made of a metal such as tungsten or molybdenum, and, in this embodiment, formed as an annular electrode defining a circular-shaped opening serving as the beam passing region 11a. However, there is concern that when the electrode 111 made of a metal is sputtered by the ion beam IB, undesired metal ions produced from the electrode 111 are mixed in the target W. Thus, the electrode 111 may be made of an electrically-conductive non-metal such as carbon or silicon.

Figure 4:
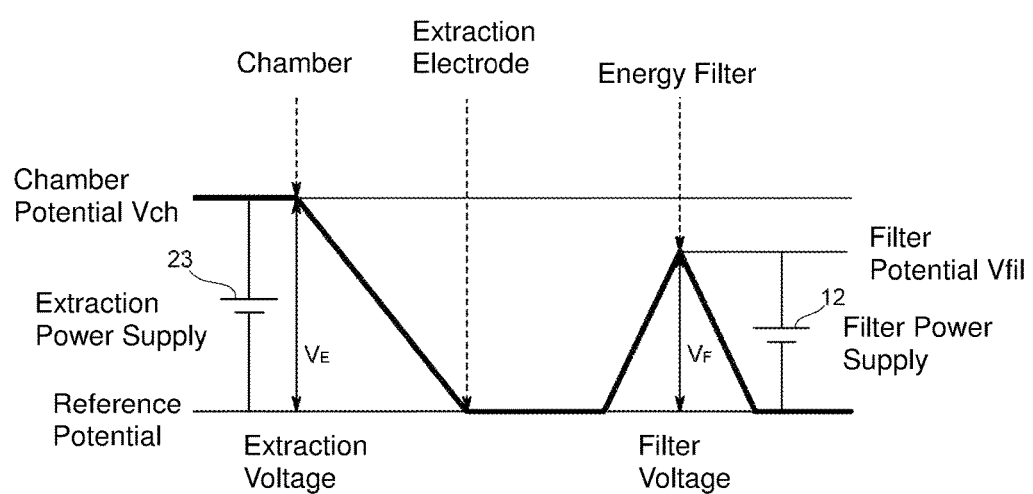
FIG. 4 is an explanatory graph of a filter potential of the energy filter.

In this embodiment, ions included in the ion beam IB have a positive charge. Thus, as depicted in FIG. 4, the energy filter 11 is configured to be applied with a filter voltage $V_F$ from the filter power supply 12 set such that a positive terminal thereof is connected to the energy filter 11, to thereby have a filter potential $V_{fil}$ so as to form a potential barrier against ions having a positive charge. Therefore, any ion having energy capable of overcoming the potential barrier becomes the passable ion, and any ion having energy less than that of the passable ion and thus failing to overcome the potential barrier, i.e., to be pushed back toward an upstream side (toward the ion source 2), becomes the non-passable ion.

Further, the filter potential $V_{fil}$ is set to cause the dopant ions to be included in the passable ions, and cause at least part of unwanted ions which cannot be separated from the dopant ions by the mass separation magnet 3 to be included in the non-passable ions.

More specifically, the filter potential $V_{fil}$ is set such that, among unwanted ions which cannot be separated from the dopant ions by the mass separation magnet 3, particularly, at least part of unwanted ions ionized in a region between the chamber 21 and the extraction electrode 22 (in a region X depicted in FIG. 2) of the ion source 2, for example, by collision with ions of a different type extracted from the chamber 21, i.e., at least part of unwanted ions ionized outside the chamber 21, can be separated from the dopant ions. It should be understood that the filter potential $V_{fil}$ is set to be less than the chamber potential $V_{ch}$ set by applying the extraction voltage $V_E$ to the chamber 21, so as to allow the ion beam IB to pass through the energy filter 11.

The unwanted ions ionized in the region X is extracted by a voltage less than that for ions ionized inside the chamber 21, i.e., by a voltage less than that the extraction voltage $V_E$, so that energy of each unwanted ion ionized in the region X is less than energy of each dopant ion ionized inside the chamber 21.

Therefore, the filter potential $V_{fil}$ in this embodiment is set to a value which is less than a per-unit valence energy obtained by dividing energy of each dopant ion by a valence thereof, and greater than a per-unit valence energy obtained by dividing energy of each unwanted ion ionized outside the chamber 21 by a valence thereof.

In this embodiment, a reference potential of the filter voltage $V_F$ to be applied to the energy filter 11 is set to be equal to the reference potential of the extraction voltage $V_E$ to be applied between the chamber 21 and the extraction electrode 22. Considering this, the filter voltage $V_F$ is set to a value (e.g., 30 kV) less than the extraction voltage $V_E$. It is to be understood that the reference potential of the filter voltage $V_F$ and the reference potential of the extraction voltage $V_E$ are not necessarily equal to each other, but each of the reference potentials may be appropriately changed.

In the ion beam irradiation apparatus 100 according to this embodiment, the filter potential $V_{fil}$ is set to cause at least part of unwanted ions which cannot be separated from the dopant ions by the mass separation magnet 3, i.e., at least part of unwanted ions ionized outside the chamber 21 of the ion source 2, to be included in the non-passable ions, so that it becomes possible to remove at least part of such unwanted ions from the ion beam IB and thus reduce unwanted ions which would otherwise be included in the ion beam IB, more effectively than before, so as to reduce metal contamination of the target W.

In this embodiment, the energy filter 11 is disposed on the downstream side of the mass separation magnet 3, so that it becomes possible to prevent the energy filter 11 from being excessively sputtered by the ion bean IB, as compared to the case where the energy filter 11 is disposed on an upstream side of the mass separation magnet 3.

In this embodiment, the electrode 111 constituting the energy filter 11 may be formed of a non-metal material. This makes it possible to prevent metal contamination of the target W due to sputtered metal atoms or ions from the electrode 111.

It should be noted that the present inventive concept is not limited to the above described exemplary embodiment.

For example, although the above exemplary embodiment has been described based on an example in which the energy filter 11 comprises one electrode 111, the energy filter 11 may comprise a plurality of electrodes 111. A specific example of this type of energy filter 11 includes an energy filter comprising three electrodes 111 each of which is formed with an opening for allowing the ion beam IB to pass therethrough and which are provided along a traveling direction of the ion beam IB, as depicted in the exemplary embodiment shown in FIG. 5. It is to be understood that the number of electrodes is not limited to three, and in other exemplary embodiments the energy filter may comprise four or more electrodes 111. Additionally, in some exemplary embodiments, it may be possible to have two electrodes 111.

Figure 5:
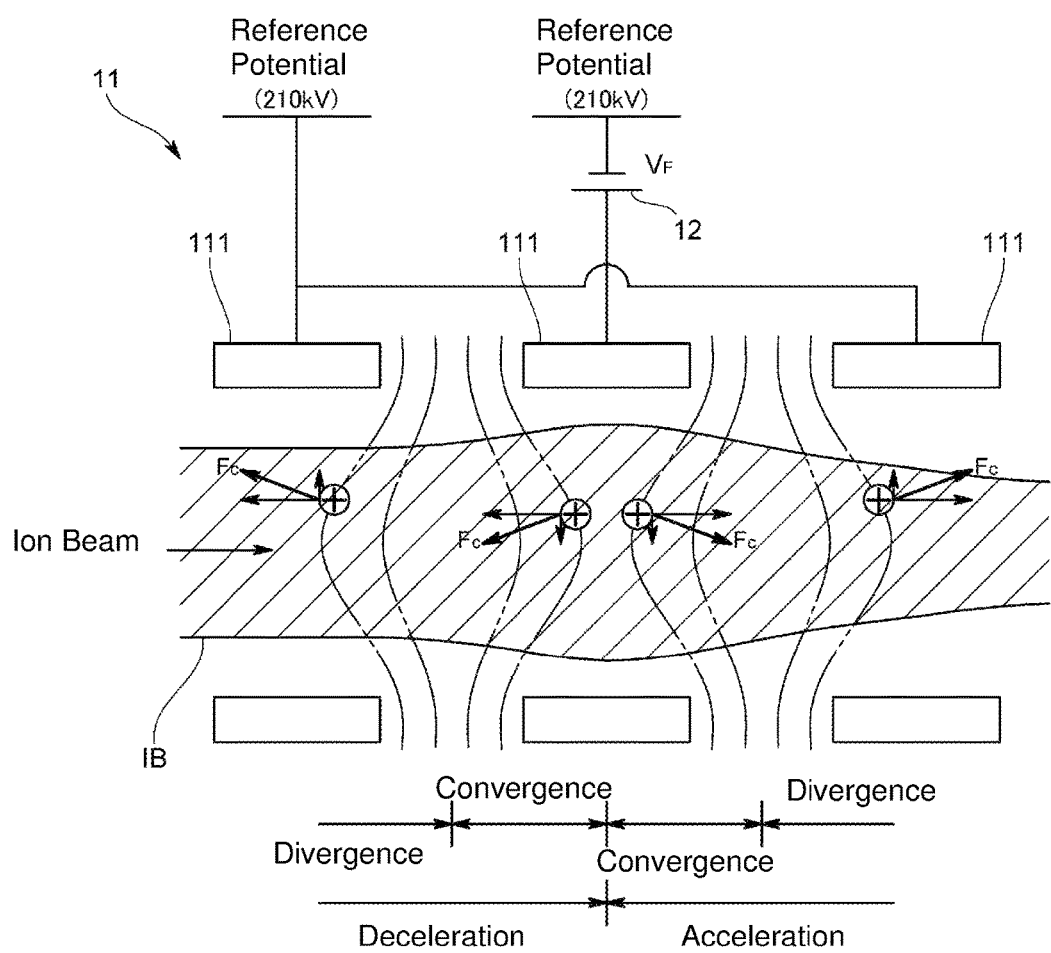
FIG. 5 is an explanatory schematic diagram of an energy filter according to another exemplary embodiment.

In the type of energy filter 11 depicted in the exemplary embodiment shown in FIG. 5, for allowing the dopant ions to be included in the passable ions and at least part of unwanted ions which cannot be separated from the dopant ions by the mass separation magnet 3 to be included in the non-passable ions, at least one of the plurality of electrodes 111 is configured to have the filter potential $V_{fil}$, and each of the remaining electrodes is configured to have a potential less than the filter potential $V_{fil}$.

As one example, assume a case where a central one of the three electrodes 111 is configured to be applied with the filter voltage $V_F$ (e.g., 30 kV) to have a positive filter potential $V_{fil}$ (240 kW), and each of the remaining outer electrodes 111 at the respective opposite ends is configured to have an equal potential (e.g., the reference potential: 210 kV) which is less than filter potential $V_{fil}$, as depicted in FIG. 5. In this case, voltage differences sequentially appearing along the traveling direction of the ion beam and a direction opposite to the traveling direction are +30 kV and −30 kV.

Thus, in the case where ions included in the ion beam IB have a positive charge, according to a Coulomb's force Fc received from an electric field, in a region around the central electrode 111, the ions travel while being directed inwardly with respect to the central electrode 111, whereas, in a region around each of the outer electrodes 111, the ions travel while being directed outwardly with respect to the outer electrode 111. Further, the ions are decelerated in a region from the upstream outer electrode 111 to the central electrode 111, and accelerated in a region from the central electrode 111 to the downstream outer electrode 111. Thus, a speed of the ions becomes lower in the region around the central electrode 111 as compared to the region around each of the outer electrodes 111, and a time for receiving the inward force becomes longer in the region around the central electrode 111, so that the ion beam IB is converged based on the so-called "principle of beam focusing in an einzel lens".

A magnitude relationship of voltages to be applied, respectively, to the electrodes 111 may be set such that the inner (central) electrode 111 has a potential greater than that of each of the outer electrodes 111, as depicted in FIG. 5, or may be set reversely, i.e., such that the inner electrode 111 has a potential less than that of each of the outer electrodes 111. That is, each of the outer electrodes 111 may be set to have the filter potential $V_{fil}$, and the inner electrode 111 may be set to have a potential less than the filter potential $V_{fil}$. The number of electrodes 111 to be set to have the filter potential $V_{fil}$ is not limited to one, but two or more electrodes 111 may be set to have the filter potential $V_{fil}$. Further, the potential less than the filter potential $V_{fil}$ is not limited to a reference potential (a potential of a beam line), but may be, for example, a ground potential.

As above, in the ion beam irradiation apparatus according to the exemplary embodiment shown in FIG. 5, it becomes possible to utilize the "principle of beam focusing in an einzel lens", while reducing unwanted ions which would otherwise be contained in the ion beam IB, more effectively than before.

In addition, each of the two electrodes 111 disposed at the respective opposite ends is configured to have an equal potential, so that it becomes possible to equalize energy of the ion beam IB between before and after the energy filter 11 and thus irradiate the target W with the ion beam IB having desired energy.

In the energy filter using three electrodes 111, as depicted in FIG. 5, wherein a central one of the electrodes 111 is configured to have the filter potential $V_{fil}$, and each of the remaining outer electrodes 111 is configured to have a ground potential or a reference potential other than the ground potential, for example, if the filter potential $V_{fil}$ is set to come closer to the chamber potential $V_{ch}$ in order to separate unwanted ions as much as possible, the ion beam IB is likely to be excessively converged.

Figure 6:
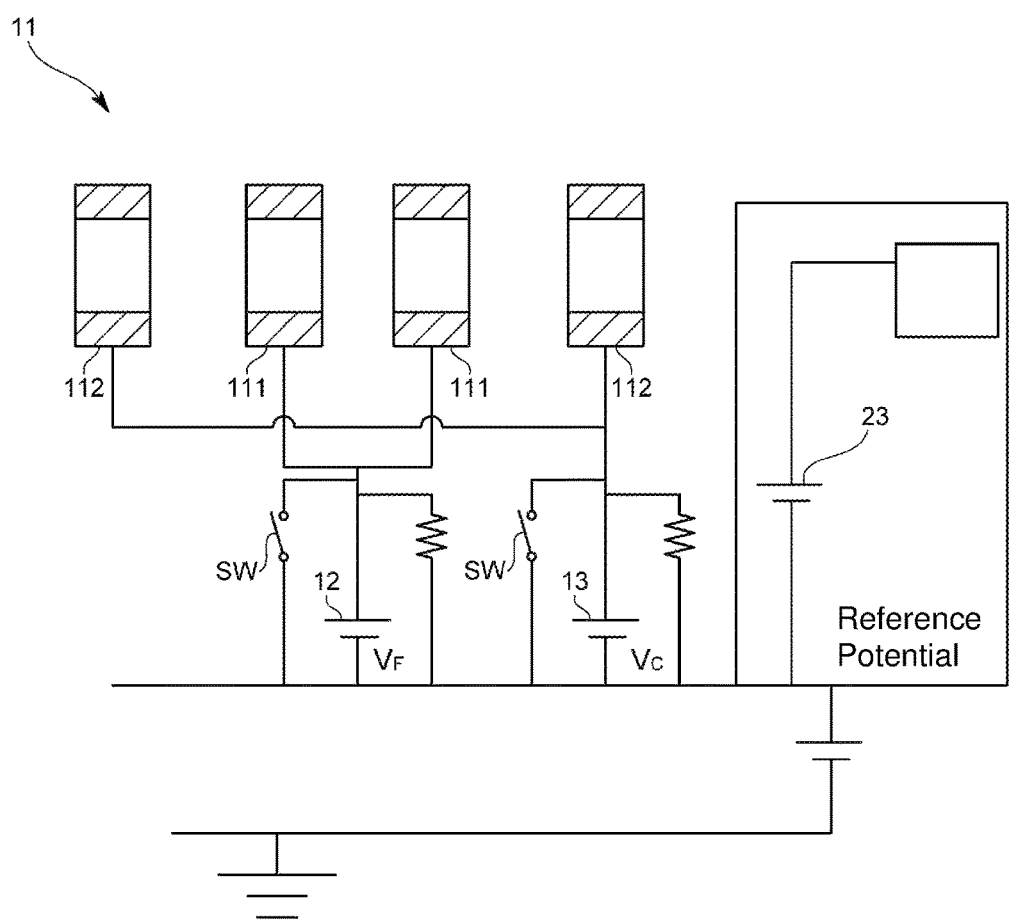
FIG. 6 is an explanatory schematic diagram of an energy filter according to another exemplary embodiment.

Therefore, as depicted an exemplary embodiment shown in FIG. 6, for making it possible to control an ion beam profile, the energy filter 11 may further comprise a profile control electrode 112 configured to be applied with a profile control voltage $V_C$ for controlling a profile of the ion beam, in addition to an electrode 111 set to have the filter potential $V_{fil}$, and an electrode (not depicted) set to have a ground potential or a potential of the beam line.

Specifically, the profile control electrode 112 is configured to be applied with a variable profile control voltage $V_C$ from a profile control power supply 13 set such that a positive terminal is connected to the profile control electrode 112.

Figure 7:
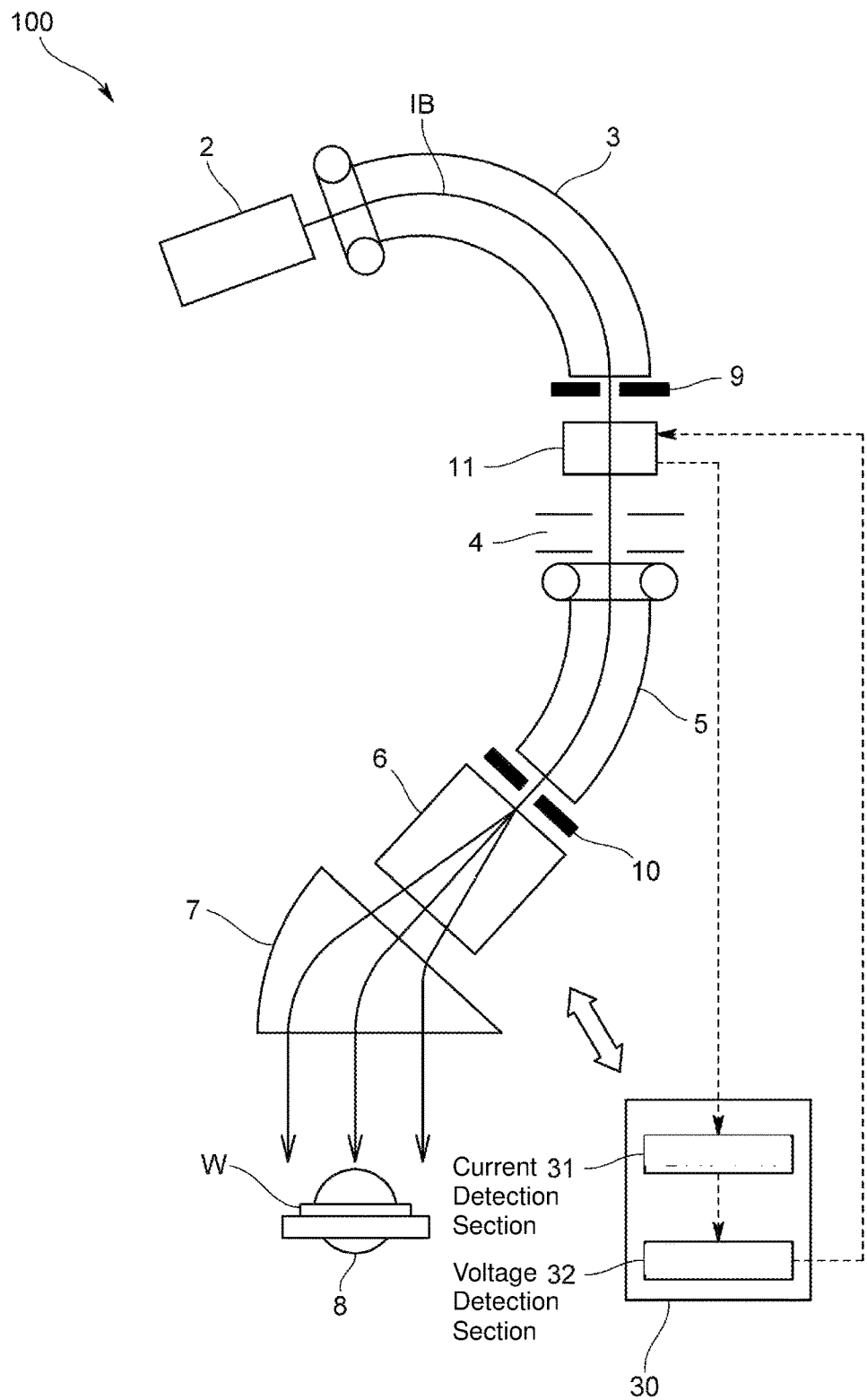
FIG. 7 is a schematic diagram depicting an overall configuration of an ion beam irradiation apparatus according to another exemplary embodiment.

In another exemplary embodiment shown in FIG. 7, the ion beam irradiation apparatus 100 may comprise a control device 30 for controlling the ion beam profile.

The control device 30 is designed to govern overall control of the ion beam irradiation apparatus 100, and includes a general-purpose or dedicated computer physically comprising a central processing unit (CPU), a memory and an input-output interface, wherein the CPU can operate in conjunction with the memory according to a given program stored in the memory to implement functions as a current detection section 31 and a voltage detection section 32.

The current detection section 31 is designed to detect a beam current of the ion beam IB passing through the energy filter 11, and configured to monitor beam current of the ion beam IB passing through the energy filter 11, for example, by instructing a non-depicted beam current measurement device to move into or out of the beam line.

The voltage control section 32 is operable, based on a current value detected by the current detection section 31, to control the profile control voltage $V_C$ to be applied from the profile control power supply 13 to the profile control electrode 112.

Specifically, the voltage control section 32 is configured to acquire a current value being monitored by the current detection section 31, and control the profile control voltage $V_C$ to allow the current value to be maximized.

As above, in the ion beam irradiation apparatus according to the exemplary embodiment of FIG. 7, it becomes possible to reshape the ion beam IB to have a profile capable of avoiding collision with each electrode 111 as the ion beam IB passes through the energy filter 11.

The current detection section 31 may be configured to detect, as a current value flowing through each electrode 111, an output value from an ammeter electrically connected to each electrode 111 constituting the energy filter 11.

In this case, the voltage control section 32 may be configured to acquire a current value from the current detection section 31, and control the profile control voltage $V_C$ to allow the current value to be minimized.

In the case where a beam profile-reshaping member (e.g., the acceleration tube 4) for reshaping a profile of the ion beam IB is provided on a downstream side of the energy filter 11, the control device 30 may be configured to reshape the profile of the ion beam IB by comprehensively controlling a voltage to be applied to the beam profile-reshaping member and the profile control voltage $V_C$.

In some exemplary embodiments, the ion beam irradiation apparatus 100 may be configured to switch, in an on-off manner, application of the filter voltage $V_F$ and the profile control voltage $V_C$ to the energy filter 11, for example, by turning on and off the filter power supply 12 and the profile control power supply 12 depicted in FIG. 6.

In the ion beam irradiation apparatus according to the exemplary embodiment shown in FIG. 7, it becomes possible to allow a user to freely select use or non-use of a filter function of the energy filter 11. Examples of the case requiring no filter function include a situation where a target W in which implantation of unwanted ions is less likely to cause a problem, such as a magnetoresistive random access memory (MRAM) made of a magnetic material, is subjected to ion implantation.

Further, as depicted in the exemplary embodiment of FIG. 6, for preventing each of the electrodes 111, 112 from having a floating potential when the filter power supply 12 or the profile control power supply 13 is turned off, the energy filter 11 may be configured to allow each of the electrodes 111, 112 to be set to have the reference potential when the filter power supply 12 or the profile control power supply 13 is turned off, by using a switch SW for example as depicted in FIG. 6.

In the case where the energy filter 11 comprises a plurality of electrodes 111, a portion of the electrodes 111 may be additionally used as an electrode of a beam line-forming member for forming a beam line through which the ion beam IB is allowed to pass, other than the energy filter 11.

Specifically, for example, in the case where the energy filter 11 is disposed between the mass separation magnet 3 and the acceleration tube 4, as in the exemplary embodiments of FIG. 1 and/or FIG. 7, one of the electrodes 111 located on a downstreammost side in the traveling direction of the ion beam may be additionally used as an upstreammost-side electrode (flange) of the acceleration tube 4.

In the ion beam irradiation apparatus according to this modification, it becomes possible to suppress increases in overall size and manufacturing cost of the apparatus, while obtaining the above advantageous effects derived by constructing the energy filter 11 using the plurality of electrodes 111.

As for the electrode 111 constituting the energy filter 11, the electrodes of the above exemplary embodiments have been described based on an annular electrode. Alternatively, a rectangular-shaped electrode formed to define a beam passing region 11*a*, or an electrode intermittently provided along a periphery of a beam passing region 11*a* and composed, for example, of a plurality of electrode elements, may also be used.

As for layout of the energy filter 11, the above exemplary embodiments have been described based on an example in which the energy filter 11 is disposed between the mass separation magnet 3 and the acceleration tube 4. Alternatively, the energy filter 11 may be disposed on the upstream side of the mass separation magnet 3, or on the downstream side of the acceleration tube 4 or the energy separation magnet 5. Alternatively, a plurality of the energy filters 11 may be provided at respective different positions.

In some exemplary embodiments, the acceleration tube 4 may be omitted from the beam line from the ion source 2 to the target W in the ion beam irradiation apparatus 100.

It should be noted that the present inventive concept is not limited to the above exemplary embodiments, but various changes and modifications may be made therein without departing from the spirit and scope thereof as set forth in appended claims.

What is claimed is:

1. An ion beam irradiation apparatus comprising:
   an ion source;
   a mass separator that sorts dopant ions having a specific mass number and valence from an ion beam extracted from the ion source, and that outputs the dopant ions; and
   an energy filter formed to define a beam passing region for allowing the ion beam to pass therethrough, and configured to have a given positive filter potential in response to application of a voltage thereto to separate passable ions capable of passing through the beam passing region and non-passable ions incapable of passing through the beam passing region, from each other by a difference in ion energy,
   wherein the given positive filter potential is set such that the dopant ions are included in the passable ions, and at least a portion of unwanted ions which cannot be separated from the dopant ions by the mass separator are included in the non-passable ions,
   wherein the energy filter comprises three or more electrodes each of which is formed with an opening for allowing the ion beam to pass therethrough, the three or more electrodes being provided along a traveling direction of the ion beam,
   wherein at least one of the three or more electrodes is configured to have the given positive filter potential, and each of the remaining electrodes is configured to have a potential less than the given positive filter potential, and wherein each of two of the electrodes disposed at respective opposite ends of the energy filter is configured to have an equal potential, and
   wherein the energy filter further comprises a profile control electrode configured to be applied with a profile control voltage for controlling a profile of the ion beam.

2. The ion beam irradiation apparatus as recited in claim 1, wherein the energy filter is disposed on a downstream side of the mass separator.

3. The ion beam irradiation apparatus as recited in claim 1, further comprising a central processing unit (CPU) configured to function as:
   a current detection section that detects a beam current of the ion beam passing through the energy filter, or a current flowing through each of the three or more electrodes, and a voltage control section that controls the profile control voltage based on a current value detected by the current detection section.

4. The ion beam irradiation apparatus as recited in claim 1, wherein one or more of the electrodes are additionally used as an electrode of a beam line-forming member that forms a beam line through which the ion beam is allowed to pass.

5. The ion beam irradiation apparatus as recited in claim 1, wherein each of the three or more electrodes is made of an electrically-conductive non-metal material.

6. The ion beam irradiation apparatus as recited in claim 1, which is configured to switch, in an on-off manner, the application of the voltage to the energy filter.

7. The ion beam irradiation apparatus as recited in claim 1, wherein at least one of the three or more electrodes comprises an annular electrode.

8. The ion beam irradiation apparatus as recited in claim 7, wherein the annular electrode is formed of an electrically-conductive non-metal material.

9. The ion beam irradiation apparatus as recited in claim 1, wherein the ion source comprises a chamber connected to an extraction voltage, and the given positive filter potential is less than the extraction voltage.

10. The ion beam irradiation apparatus as recited in claim 1, wherein the mass separator sorts positively charged dopant ions from the ion beam.

11. An apparatus comprising:
an ion source that outputs an ion beam;
a mass separator that separates dopant ions from the ion beam and outputs the dopant ions; and
an energy filter comprising a profile control electrode and at least three filter electrodes, and a power source connected to the profile control electrode and to the at least three filter electrodes, the power source configured to supply a positive voltage to at least one electrode of the at least three filter electrodes, to supply a lower voltage than the positive voltage to remaining ones of the at least three filter electrodes, and to supply a profile control voltage to the profile control electrode, wherein each of the two electrodes on opposite ends of the energy filter has an equal voltage.

12. The apparatus as recited in claim 11, wherein the energy filter separates unwanted ions from the dopant ions, wherein at least a portion of the unwanted ions are ions that cannot be separated by the mass separator.

13. The apparatus as recited in claim 11, wherein an extraction voltage is applied to the ion source, and the positive voltage is less than the extraction voltage.

14. The apparatus as recited in claim 11, wherein at least one of the at least three electrodes comprises an annular electrode.

15. The apparatus as recited in claim 11, wherein the lower voltage is a reference voltage.

16. The apparatus of claim 11, wherein the mass separator separates positively charged dopant ions from the ion beam.

* * * * *